(12) United States Patent
Takeda et al.

(10) Patent No.: US 12,327,808 B2
(45) Date of Patent: Jun. 10, 2025

(54) SEMICONDUCTOR DEVICE

(71) Applicant: Hitachi Power Semiconductor Device, Ltd., Hitachi (JP)

(72) Inventors: Naoki Takeda, Tokyo (JP); Hisashi Tanie, Tokyo (JP); Kisho Ashida, Tokyo (JP); Yu Harubeppu, Tokyo (JP); Tomohiro Onda, Hitachi (JP); Masato Nakamura, Hitachi (JP)

(73) Assignee: HITACHI POWER SEMICONDUCTOR DEVICE, LTD., Ibaraki (JP)

( * ) Notice: Subject to any disclaimer, the term of this patent is extended or adjusted under 35 U.S.C. 154(b) by 429 days.

(21) Appl. No.: 17/874,603

(22) Filed: Jul. 27, 2022

(65) Prior Publication Data

US 2023/0074352 A1 Mar. 9, 2023

(30) Foreign Application Priority Data

Sep. 7, 2021 (JP) .................................. 2021-145310

(51) Int. Cl.
*H01L 23/00* (2006.01)
*H01L 25/16* (2023.01)

(52) U.S. Cl.
CPC .............. *H01L 24/29* (2013.01); *H01L 24/32* (2013.01); *H01L 24/48* (2013.01); *H01L 25/165* (2013.01); *H01L 2224/29111* (2013.01); *H01L 2224/29139* (2013.01); *H01L 2224/29147* (2013.01); *H01L 2224/3201* (2013.01);

(Continued)

(58) Field of Classification Search
None
See application file for complete search history.

(56) References Cited

U.S. PATENT DOCUMENTS

| 2007/0145540 | A1 | 6/2007 | Mochida |
| 2021/0143081 | A1 | 5/2021 | Takeda et al. |
| 2021/0287971 | A1* | 9/2021 | Hara ..................... H10D 64/232 |

FOREIGN PATENT DOCUMENTS

| EP | 3171401 A2 | 5/2017 |
| EP | 3823019 A2 | 5/2021 |

(Continued)

OTHER PUBLICATIONS

Partial European Search Report issued on Feb. 8, 2023 for European Patent Application No. 22180895.9.

(Continued)

*Primary Examiner* — Nishath Yasmeen
(74) *Attorney, Agent, or Firm* — Volpe Koenig (57) ABSTRACT

Provide is a highly reliable semiconductor device in which stress generated in a semiconductor chip is reduced and an increase in thermal resistance is suppressed. The semiconductor device includes: a semiconductor chip including a first main electrode on one surface thereof and a second main electrode and a gate electrode on the other surface thereof; a first electrode connected to the one surface of the semiconductor chip via a first bonding material; and a second electrode connected to the other surface of the semiconductor chip via a second bonding material. The first electrode is a plate-shaped electrode and has a groove in a region overlapping with the semiconductor chip. The groove penetrates in a thickness direction of the first electrode and reaches an end portion of the first electrode when viewed in a plan view.

8 Claims, 9 Drawing Sheets

(52) U.S. Cl.
CPC ............... *H01L 2224/32059* (2013.01); *H01L 2224/32245* (2013.01); *H01L 2224/48137* (2013.01); *H01L 2924/13091* (2013.01); *H01L 2924/3512* (2013.01)

(56) References Cited

FOREIGN PATENT DOCUMENTS

| | | | | |
|---|---|---|---|---|
| JP | 5332672 | A | | 3/1978 |
| JP | 554983 | A | | 1/1980 |
| JP | S56-104458 | A | | 8/1981 |
| JP | 5766655 | A | | 4/1982 |
| JP | 6366958 | A | | 3/1988 |
| JP | H0422162 | | * | 5/1990 |
| JP | H04-333275 | A | | 11/1992 |
| JP | 0823068 | A | | 1/1996 |
| JP | H10-163407 | A | | 6/1998 |
| JP | 2007-173680 | A | | 7/2007 |
| JP | 2008-034416 | A | | 2/2008 |
| JP | 2014-107506 | A | | 6/2014 |
| JP | 2021-77777 | A | * | 11/2019 |
| JP | 2021-077777 | A | | 5/2021 |

OTHER PUBLICATIONS

Japanese Office Action issued on Oct. 22, 2024 for Japanese Patent Application No. 2021-145310.

* cited by examiner

SEMICONDUCTOR DEVICE

CLAIM OF PRIORITY

The present application claims priority from Japanese Patent application serial No. 2021-145310, filed on Sep. 7, 2021, the content of which is hereby incorporated by reference into this application.

BACKGROUND OF THE INVENTION

1. Field of the Invention

The present invention relates to a semiconductor device.

2. Description of the Related Art

With spread of power semiconductors worldwide, in semiconductor devices used for switching circuits and rectifier circuits, a mounting technique for various requirements such as a large current, high heat dissipation, and high reliability has been developed.

As the mounting technique of the power semiconductor, there is a double-sided mounting structure in which electrodes are provided on an upper surface and a lower surface of a semiconductor chip, and at least one electrode on both the upper surface and the lower surface is connected to an external electrode. Examples of the semiconductor chip having electrodes on the upper surface and the lower surface include a metal oxide semiconductor field effect transistor (MOSFET), an insulated gate bipolar transistor (IGBT), and the like.

The MOSFET includes a source electrode and a gate electrode on one surface thereof and a drain electrode on the other surface thereof.

The IGBT includes an emitter electrode and a gate electrode on one surface thereof and a collector electrode on the other surface thereof. A surface protective film is usually formed on an outer peripheral portion of either surface of a power semiconductor chip. The surface protective film is formed on a source electrode side in the MOSFET and on an emitter electrode side in the IGBT. In the case of the IGBT, if the IGBT includes a diode, the surface protective film is formed on either a P pole side or an N pole side.

As an example of such a semiconductor device having the double-sided mounting structure, JP-A-2014-107506 (Patent Literature 1) discloses a semiconductor module including a semiconductor chip including electrodes on both electrode surfaces, and a pair of module substrates each disposed on each electrode surface of the semiconductor chip and having a surface wiring layer including the electrode on a substrate surface, in which a groove is formed in the electrode of the surface wiring layer of the module substrate. Patent Literature 1 discloses an example in which a lattice-shaped groove is formed in a back surface wiring layer of the module substrate. Patent Literature 1 also describes an effect of reducing a thermal stress caused by a difference in thermal expansion coefficient of a material forming the module substrate.

JP-A-2007-173680 (Patent Literature 2) discloses a semiconductor device including a pair of metal electrodes provided such that inner surfaces thereof face each other and having heat dissipation, a semiconductor chip provided so as to be sandwiched between the two metal electrodes and electrically connected to inner surfaces of the two metal electrodes, ceramic insulating substrates each provided on an outer surface of each metal electrode and having heat dissipation, in which at least one of the pair of metal electrodes has a stacked structure in which a plurality of layers are stacked in ascending order of a thermal expansion coefficient from an outer surface side toward the inner surface side. Patent Literature 2 discloses an example in which a slit is provided in at least one of the pair of metal electrodes. Patent Literature 2 also describes an effect of reducing the thermal stress generated in the metal electrodes by the slit.

Since Pb has a low melting point and low elasticity, in the related art, a solder containing Pb as a main component has been widely used as a bonding material for the semiconductor device. However, in recent years, due to consideration for the environment, restrictions on the use of Pb have been tightened, and the development of Pb-free materials is being promoted. As the Pb-free materials, for example, a solder containing Sn as the main component such as Sn—Sb or Sn—Ag—Cu, or a bonding material that uses Cu or Ag and is sintered at a high temperature is generally used.

These Pb-free materials have higher elasticity than the solder containing Pb, and have a problem that the stress of the semiconductor chip increases due to heating and cooling in a bonding step.

In order to prevent the occurrence of cracks in the semiconductor chip, it is important to reduce stress. In particular, in the double-sided mounting structure which is often used in the power semiconductor, it is necessary to increase a joining area as much as possible in order to flow a large current, and stress tends to increase.

When the stress is reduced, a shape of the electrode to be bonded to the semiconductor chip is devised so as to reduce thermal deformation of the semiconductor chip at the time of solder connection. In general, the thermal deformation of the semiconductor chip can be reduced by reducing an area of the electrode bonded to the semiconductor chip. However, a heat transfer area between the semiconductor chip and the electrode becomes small, thermal resistance at the time of using a product increases, and heat dissipation performance decreases. Therefore, there is a problem of suppressing an increase in the thermal resistance while reducing the stress of the semiconductor chip in the bonding step.

In the semiconductor module described in Patent Literature 1, as shown in FIGS. 4 and 9 of Patent Literature 1, a substrate electrode (52) bonded to a gate electrode (30) is provided with a groove (55) having a thickness smaller than that of other portions, and a lattice-shaped groove (80) is formed in back surface wiring layers (70, 71). However, the grooves (55, 80) are not formed in substrate electrodes (51, 61) bonded to a source electrode (31) and a drain electrode (32) in which an area of a bonded portion is large. Therefore, it is considered that an effect of reducing the thermal stress cannot be sufficiently obtained.

In the semiconductor device described in Patent Literature 2, since a slit (16) does not reach an end portion of a metal electrode as shown in FIGS. 7 and 8 of Patent Literature 2, when the semiconductor chip is bonded to the end portion without the slit, it is considered that the thermal stress transmitted to the semiconductor chip cannot be reduced in the vicinity of the end portion.

SUMMARY OF THE INVENTION

An object of the invention is to provide a highly reliable semiconductor device in which a stress generated in a semiconductor chip is reduced and an increase in thermal resistance is suppressed.

The invention is a semiconductor device including: a semiconductor chip including a first main electrode on one surface thereof and a second main electrode and a gate electrode on the other surface thereof; a first electrode connected to the one surface of the semiconductor chip via a first bonding material; and a second electrode connected to the other surface of the semiconductor chip via a second bonding material, in which the first electrode is a plate-shaped electrode and has a groove in a region overlapping with the semiconductor chip, the groove has a structure that penetrates in a thickness direction of the first electrode and has a shape that reaches an end portion of the first electrode when viewed in a plan view.

According to the invention, it is possible to provide a highly reliable semiconductor device in which the stress generated in the semiconductor chip is reduced and the increase in thermal resistance is suppressed.

DESCRIPTION OF THE PREFERRED EMBODIMENTS

The present disclosure relates to a structure of a semiconductor device, and particularly, to a technique effectively applied to a mounting structure of a power semiconductor for power control. The technique is particularly effective for the semiconductor device having a double-sided mounting structure.

Hereinafter, embodiments of the semiconductor device according to the present disclosure will be described in detail with reference to the drawings. The content of the present disclosure is not limited to the embodiments.

First Embodiment

Figure 1:
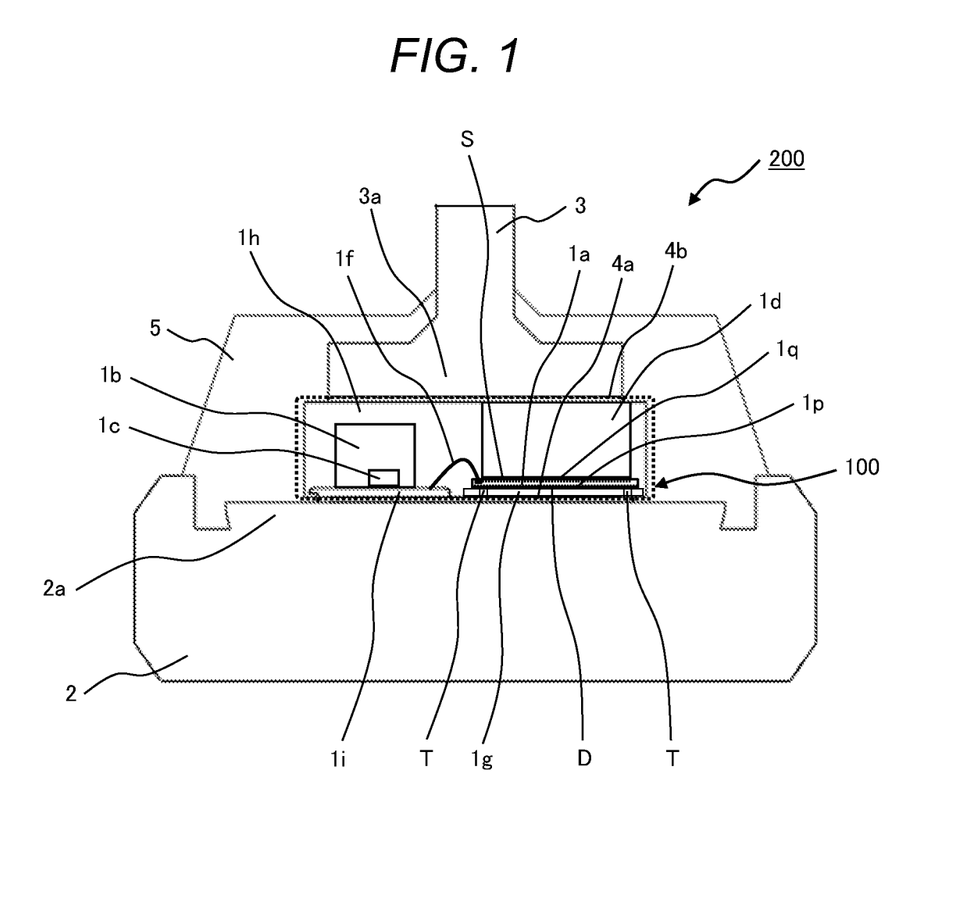
FIG. 1 is a schematic vertical sectional view showing a semiconductor device according to a first embodiment.

FIG. 1 is a schematic vertical sectional view showing a semiconductor device according to a first embodiment.

A semiconductor device 200 shown in FIG. 1 is used as a rectifier element of an on-vehicle AC generator (alternator).

In FIG. 1, the semiconductor device 200 includes an electronic circuit body 100, a base 2 including a pedestal 2a at an upper portion thereof, and a lead 3 including a lead header 3a at a lower portion thereof. The electronic circuit body 100 has a rectifying function. A range covered by the electronic circuit body 100 is shown by a dotted line. The base 2 and the lead 3 are terminals through which the electronic circuit body 100 is electrically connected to an external circuit. Further, the pedestal 2a and a part located on the upper portion of the base 2, the lead header 3a and a part located on the lower portion of the lead 3, and the electronic circuit body 100 are covered and sealed with a mold resin 5.

The electronic circuit body 100 includes a semiconductor chip 1a (semiconductor chip), a capacitor 1b, and a control circuit chip 1c. In addition, the electronic circuit body 100 includes a lower electrode 1g, an upper electrode 1d (source block), and a lead frame 1i.

The pedestal 2a and the lower electrode 1g of the electronic circuit body 100 are connected via a conductive bonding material 4a. The lead header 3a and the upper electrode 1d of the electronic circuit body 100 are connected via a conductive bonding material 4b. In the present specification, the lower electrode 1g is also referred to as a "first electrode", and the upper electrode 1d is also referred to as a "second electrode".

In the present embodiment, the semiconductor chip 1a is a MOSFET. The MOSFET includes a drain electrode D and a source electrode S. In FIG. 1, the drain electrode D is provided on a lower surface portion, and the source electrode S is provided on an upper surface portion. That is, the semiconductor chip 1a has the double-sided mounting structure. A surface of the semiconductor chip 1a on a side where the drain electrode D is provided is referred to as a "first main surface" of the semiconductor chip 1a, and a surface of the semiconductor chip 1a on a side where the source electrode S is provided is referred to as a "second main surface" of the semiconductor chip 1a.

The drain electrode D is connected to an upper surface portion of the lower electrode 1g, which is a first internal electrode, via a conductive bonding material 1p. However, when the conductive bonding material 1p is not used, the drain electrode D may be connected by ultrasonic bonding or the like.

The source electrode S is connected to a lower surface portion of the upper electrode 1d, which is a second internal electrode, via a conductive bonding material 1q. However, when the conductive bonding material 1q is not used, the source electrode S may be connected by ultrasonic bonding or the like.

The control circuit chip 1c is connected to an upper surface portion of the lead frame 1i, which is a support, via a conductive bonding material.

The capacitor 1b that supplies power to the control circuit chip 1c is also connected to the upper surface portion of the lead frame 1i via the conductive bonding material. As the capacitor 1b, for example, a ceramic capacitor can be used.

A lower surface portion of the lower electrode 1g is exposed from a lower surface portion of the electronic circuit body 100 without being covered with the mold resin 5. The lower surface portion of the lower electrode 1g is connected to the pedestal 2a via the conductive bonding material 4a.

An upper surface portion of the upper electrode 1d is exposed from an upper surface portion of the electronic circuit body 100. The upper surface portion of the upper electrode 1d is connected to the lead header 3a via the conductive bonding material 4b.

Materials of the conductive bonding materials 1p, 1q, 4a, 4b, and the like are commonly used solders, alloys containing Au, Ag, or Cu, conductive adhesive materials, and the like. As the solder, a general high-lead solder, a eutectic solder, a lead-free solder, and the like are used. As the conductive adhesive material, a material in which a metal filler such as Ag, Cu, or Ni is mixed with a resin, or a material composed only of metal is used. The materials of the conductive bonding materials 1p, 1q, 4a, 4b, and the like may be the same material or different materials. The conductive bonding materials 1p and 1q may be form of the same material or different materials above and below the semiconductor chip 1a. The conductive bonding materials 4a and 4b may be formed of the same material or different materials above and below the electronic circuit body 100.

As the materials of the base 2, the lead 3, and the lower electrode 1g, the upper electrode 1d, and the lead frame 1i inside the electronic circuit body 100, Cu having high thermal conductivity and excellent conductivity is mainly used, and CuMo, 42 alloy, Al, Au, Ag, or the like may be used. At this time, in order to improve connection stability, it is desirable to plate Au, Pd, Ag, Ni, or the like on a connection portion with the conductive bonding material.

The control circuit chip 1c is electrically connected to the semiconductor chip 1a via a wire 1f. For example, when the semiconductor chip 1a is a power MOSFET, the gate electrode formed on the semiconductor chip 1a and the control circuit chip 1c are connected via the wire 1f, and the control circuit chip 1c controls a gate voltage of the power MOSFET. Accordingly, a large current can flow through the semiconductor chip 1a having a switching function.

Further, the capacitor 1b is electrically connected to the semiconductor chip 1a and the control circuit chip 1c by the lead frame 1i and the wire 1f. The capacitor 1b has a function of supplying power necessary for driving the control circuit chip 1c.

The semiconductor chip 1a has a function of switching the large current. For example, the semiconductor chip (switching circuit chip) 1a having the switching function is a semiconductor chip including an IGBT, a gate turn-off thyristor (GTO), and a power MOSFET. The semiconductor chip 1a is a thyristor or the like that performs on/off control of the large current, and may be made of Si, SiC, SiN, GaAs, or the like.

The control circuit chip 1c is a semiconductor chip that controls the semiconductor chip 1a that switches the large current. The control circuit chip 1c itself is a semiconductor chip that does not include the semiconductor chip that switches the large current. That is, the control circuit chip 1c is a semiconductor chip in which, for example, a plurality of logic circuits, analog circuits, driver circuits, and the like are provided, and a microprocessor and the like are formed as necessary. The control circuit chip 1c may also have a function of controlling a large current flowing through the semiconductor chip 1a.

The semiconductor chip 1a, the control circuit chip 1c, the capacitor 1b, the lower electrode 1g, the upper electrode 1d, and the conductive bonding materials 1p and 1q are entirely covered and sealed with a resin 1h. Thereby, the electronic circuit body 100 is formed.

The lower surface portion of the lower electrode 1g and the upper surface portion of the upper electrode 1d are exposed to an outside of the electronic circuit body 100 without being covered with the resin 1h of the electronic circuit body 100.

Therefore, the upper surface portion of the upper electrode 1d of the electronic circuit body 100 can be electrically connected to the lead header 3a via the conductive bonding material 4b. The lower surface portion of the lower electrode 1g of the electronic circuit body 100 can be electrically connected to the pedestal 2a via the conductive bonding material 4a.

As described above, the electronic circuit body 100 is sealed with the resin 1h and is integrally formed. An exposed portion of the lower electrode 1g is electrically connected to the pedestal 2a of the base 2 via the conductive bonding material 4a. An exposed portion of the upper electrode 1d is electrically connected to the lead header 3a of the lead 3 via the conductive bonding material 4b. The semiconductor device 200 is formed by covering the entire electronic circuit body 100 and a part of the base 2 and the lead 3 with the mold resin 5.

The electronic circuit body 100 is reversed upside down at the time of manufacturing so that P and N polarities of the semiconductor device 200 can be switched.

As shown in FIG. 1, it is desirable that the upper electrode 1d connected to the source electrode S of the semiconductor chip 1a is thicker than the lower electrode 1g. Here, increasing a thickness means increasing a length in a direction from the pedestal 2a to the lead header 3a.

Since a heat capacity of the upper electrode 1d becomes larger by increasing a thickness of the upper electrode 1d, heat generated due to a loss when a current flows through the source electrode S can be absorbed on an upper electrode 1d side. Accordingly, an increase in temperature of the semiconductor chip 1a can be prevented.

By increasing the thickness of the upper electrode 1d, the upper electrode 1d can be higher than the capacitor 1b, and the upper electrode 1d can be connected to the lead header 3a as a terminal of the electronic circuit body 100.

Figure 2:
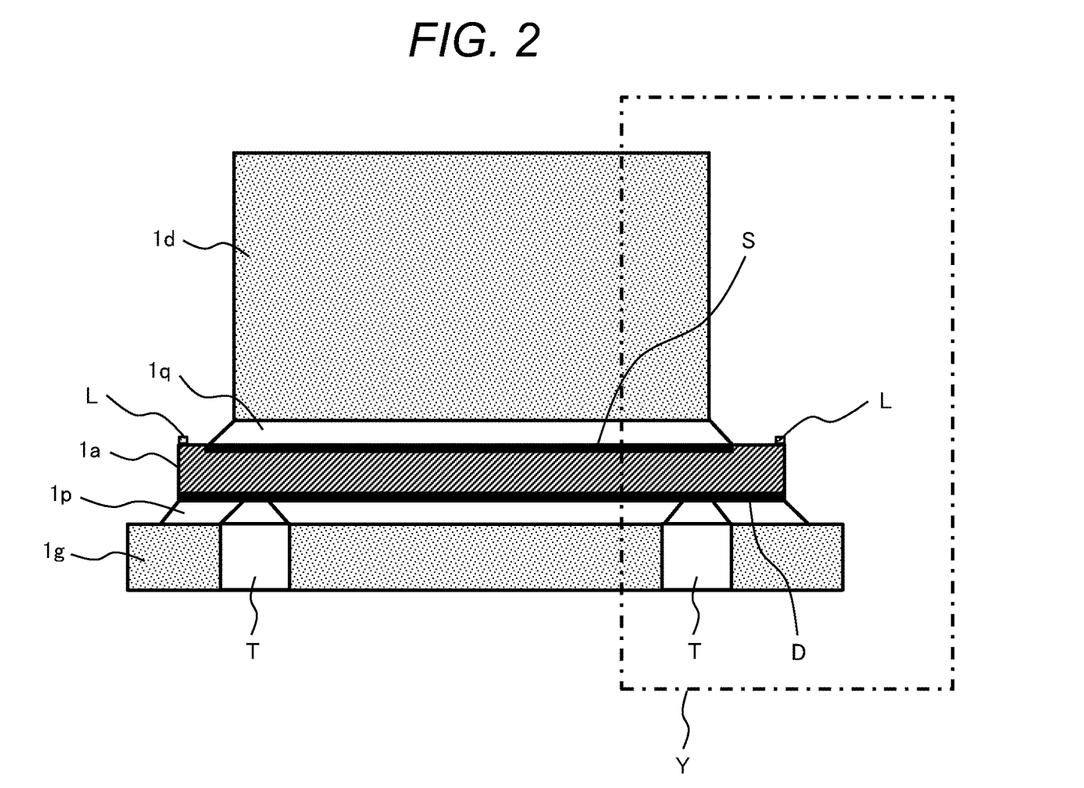
FIG. 2 is an enlarged vertical sectional view showing a semiconductor chip of FIG. 1 and components located above and below the semiconductor chip.

FIG. 2 is an enlarged vertical sectional view showing the semiconductor chip 1a of FIG. 1 and components located above and below the semiconductor chip 1a.

As shown in FIG. 2, the semiconductor chip 1a (semiconductor chip) includes the drain electrode D (first main electrode) on a surface (one surface) on a lower electrode 1g side, and a gate electrode C (not shown, see FIG. 3) and the source electrode S (second main electrode) on a surface (the other surface) on the upper electrode 1d side. The semiconductor chip 1a includes a surface protective film L (guard ring) on an outer peripheral portion of a surface on a gate electrode C side.

The lower electrode 1g is a plate-shaped electrode.

A surface of the semiconductor chip 1a on a source electrode S side is connected to the lower surface portion of the upper electrode 1d via the conductive bonding material 1q. A surface on a drain electrode D side is connected to the upper surface portion of the lower electrode 1g via the conductive bonding material 1p. The conductive bonding materials 1p and 1q are also simply referred to as "bonding materials". The conductive bonding material 1p may be referred to as a "first bonding material" and the conductive bonding material 1q may be referred to as a "second bonding material" so as to be distinguished from each other.

A length of the upper electrode 1d is shorter than that of the semiconductor chip 1a. Both an end portion of the upper electrode 1d and an end portion of a connection portion between the upper electrode 1d and the semiconductor chip 1a are inside the semiconductor chip 1a. An end portion of the lower electrode 1g connected to the semiconductor chip 1a is located outside an end portion of the semiconductor chip 1a. The lower electrode 1g is provided with grooves T. The grooves T each penetrate in a thickness direction of the lower electrode 1g. At least a part of the groove T of the lower electrode 1g overlaps the semiconductor chip 1a. The groove T can be formed by press working or etching.

In summary, the lower electrode 1g is the plate-shaped electrode and has the groove T in a region overlapping with the semiconductor chip 1a.

Figure 3:
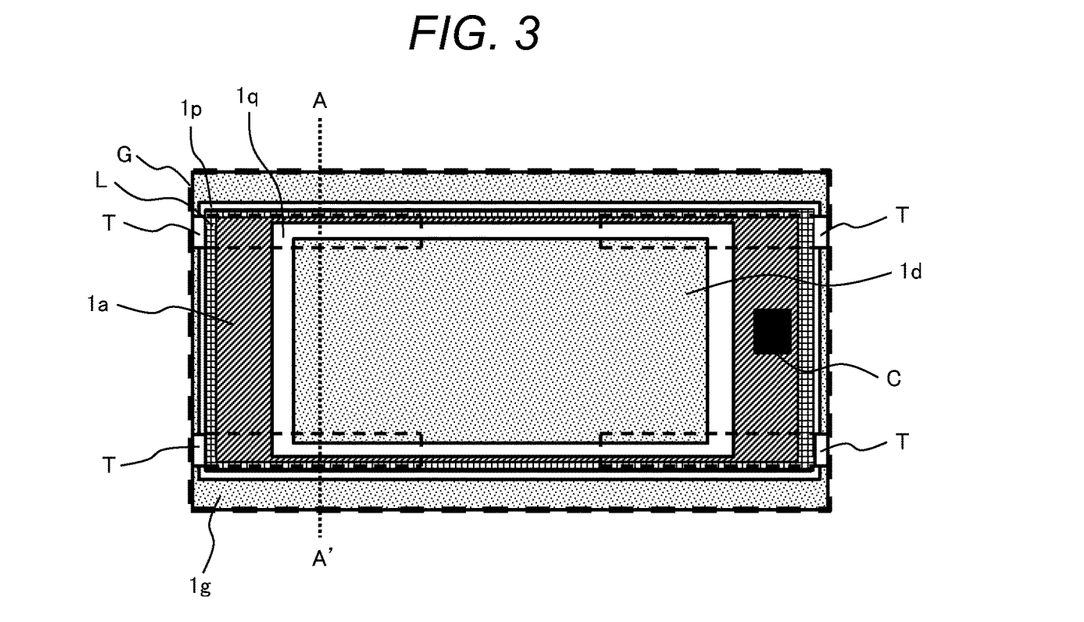
FIG. 3 is a plan view partially showing an electronic circuit body of FIG. 1.

FIG. 3 is a plan view partially showing the electronic circuit body 100 of FIG. 1. A cross-section taken along a line A-A' in FIG. 3 corresponds to the cross-section in FIG. 2.

As shown in FIG. 3, the semiconductor chip 1a (semiconductor chip) includes the gate electrode C on the surface (the other surface) on the upper electrode 1d side.

Four grooves T are provided along a longitudinal direction of the lower electrode 1g, and each have a shape that reaches the end portion of the lower electrode 1g. In other words, the grooves T penetrate in the thickness direction of the first electrode, and each have the shape that reaches the end portion of the first electrode when viewed in a plan view.

The grooves T provided in the lower electrode 1g reach an outer peripheral line G of the lower electrode 1g (emphasized by a broken line in FIG. 3). When the grooves T reach the end portion of the lower electrode 1g, deformation of the semiconductor chip 1a due to a thermal stress can be suppressed as described later.

Next, a method of manufacturing the electronic circuit body 100, which is a component of the semiconductor device 200, will be described.

First, the lower electrode 1g, one conductive bonding material, the semiconductor chip 1a, the other conductive bonding material, and the upper electrode 1d are stacked in this order. The stacked layers are heated to melt the conductive bonding materials to form layers of the conductive bonding materials 1p and 1q. Then, the stacked layers are cooled to room temperature.

In a cooling step, thermal strain is generated in all of the upper electrode 1d, the lower electrode 1g, and the semiconductor chip 1a. Since when the upper electrode 1d and the lower electrode 1g are Cu and the semiconductor chip 1a is Si, respective thermal expansion coefficients are $16.8 \times 10^{-6}$ [K$^{-1}$] and $2.4 \times 10^{-6}$ [K$^{-1}$], the upper electrode 1d and the lower electrode 1g shrink more than the semiconductor chip 1a. Accordingly, bending deformation occurs in the upper electrode 1d, the lower electrode 1g, and the semiconductor chip 1a, and the thermal stress is generated in each member.

Figure 4:
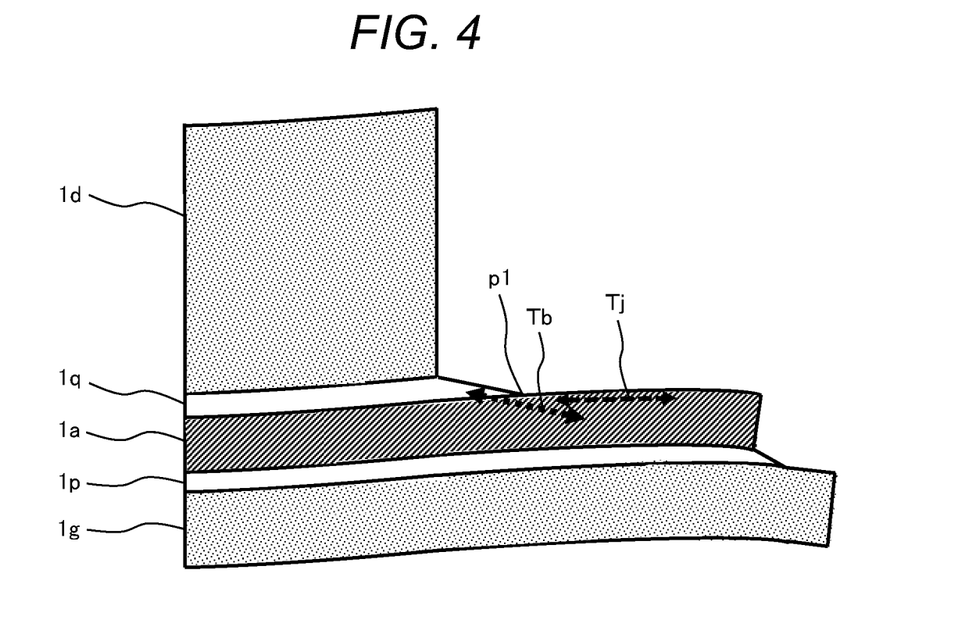
FIG. 4 is a partial vertical sectional view showing a semiconductor device having a structure of the related art.

FIG. 4 is a partial vertical sectional view showing a semiconductor device having a structure of the related art.

In FIG. 4, a portion corresponding to a region Y in FIG. 2 is enlarged and shown.

As shown in FIG. 4, in the structure of the related art, a length of the lower electrode 1g is longer than that of the semiconductor chip 1a. The length of the upper electrode 1d is shorter than that of the semiconductor chip 1a. Therefore, the length of the conductive bonding material 1p provided between the lower electrode 1g and the semiconductor chip 1a is longer than that of the conductive bonding material 1q provided between the upper electrode 1d and the semiconductor chip 1a.

Since the lower electrode 1g and the upper electrode 1d shrink more than the semiconductor chip 1a during cooling, a force applied to the semiconductor chip 1a from the conductive bonding material 1p is larger than a force applied to the semiconductor chip 1a from the conductive bonding material 1q. Therefore, the semiconductor chip 1a after cooling has an upward-convex shape.

At a point p1 shown in FIG. 4, due to the bending deformation of the semiconductor chip 1a, tensile stress of an arrow Tb is generated, and tensile stress of an arrow Tj is also generated from the conductive bonding material 1p at the same time, so that the stress is concentrated at the point p1. When a highly rigid bonding material such as the lead-free solder or a sintered material is used for the conductive bonding materials 1p and 1q, the stress at the point p1 increases, and a risk of cracking in the semiconductor chip 1a increases.

Figure 5:
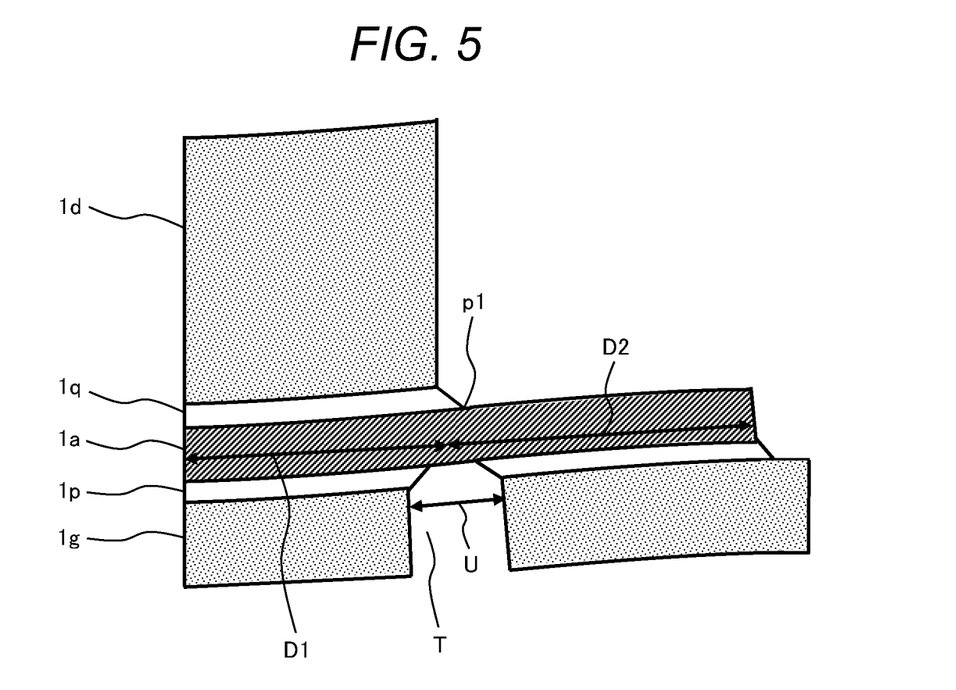
FIG. 5 is a partial vertical sectional view showing the semiconductor device according to the first embodiment.

FIG. 5 is a partial vertical sectional view showing the semiconductor device according to the present embodiment.

In FIG. 5, the portion corresponding to the region Y in FIG. 2 is enlarged and shown.

In FIG. 5, the groove T is provided in the lower electrode 1g. The groove T penetrates in the thickness direction of the lower electrode 1g. By the groove T, the stress in regions D1 and D2 of the semiconductor chip 1a is generated separately. Therefore, the stress is smaller than that of the structure of the related art. Accordingly, the stress at the point p1 can be greatly reduced.

When the groove T does not penetrate, influence of a continuous portion of the lower electrode 1g remains, so that an effect of reducing the stress generated in the regions D1 and D2 cannot be sufficiently obtained.

It is desirable that a width U of the groove T is wider than a thickness of the conductive bonding material 1p. When the width U of the groove T is narrow, the conductive bonding material 1p gets wet and spreads during manufacture, so that the groove T is filled with the conductive bonding material 1p, and since the lower electrode 1g is bonded between the regions D1 and D2, the stress is transmitted through a bonding portion thereof. Such a configuration is not desirable because a stress reducing effect is lost.

By providing the groove T in the lower electrode 1g, a highly reliable semiconductor device can be manufactured even when a highly rigid lead-free bonding material such as the lead-free solder or the sintered material is used as the conductive bonding material 1p.

Further, by working out a position of the groove T, for example, aligning the groove T with the end portion of the upper electrode 1d in a vertical direction, a heat dissipation path of the semiconductor chip 1a can be secured, and an increase in thermal resistance can be suppressed. In other words, it is desirable that the groove T is provided at a position overlapping with the upper electrode 1d. In this case, it is desirable that the groove T and the semiconductor chip 1a overlap each other, and the upper electrode 1d overlaps above the groove T.

Next, an effect of reducing the thermal stress and a change in the thermal resistance will be quantitatively described with reference to FIGS. 6 to 8.

Figure 6:
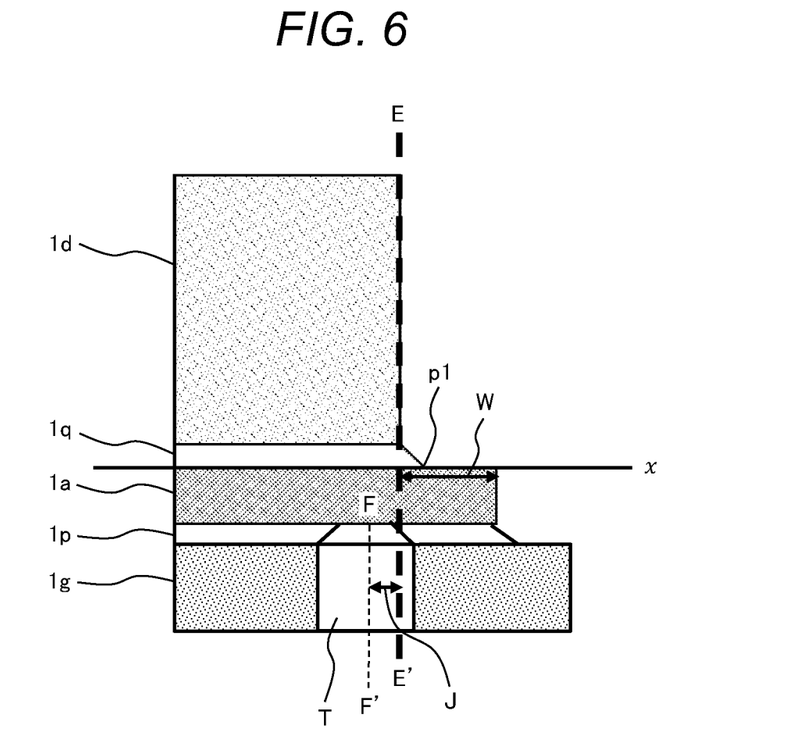
FIG. 6 is a vertical sectional view geometrically showing the same portion as the semiconductor device shown in FIG. 5.

FIG. 6 is a vertical sectional view geometrically showing the same portion as the semiconductor device shown in FIG. 5.

FIG. 6 shows the definitions of coordinates and parameters used when examining the thermal stress and the thermal resistance generated in the manufactured semiconductor chip 1*a*.

In FIG. 6, a direction parallel to an upper surface of the semiconductor chip 1*a* and orthogonal to a longitudinal direction of the groove T is set as an x-axis. A distance from an end portion E-E' (a right end of the upper electrode 1*d* in FIG. 6) of a connection surface of the upper electrode 1*d* with the semiconductor chip 1*a* to the end portion of the semiconductor chip 1*a* is set to W. A distance from the end portion E-E' to a center line F-F' of the groove T (an axis of symmetry of the width of the groove T in a lateral direction) is set to J. In order to examine the case where the position of the groove T is changed, J is used as a parameter. When the center line F-F' of the groove T is closer to a center of the semiconductor chip 1*a* (on a left side in FIG. 6) than the end portion E-E' of the upper electrode 1*d*, J takes a negative value. Herein, a parameter normalized by dividing J by W is defined as X.

In the example shown in FIG. 6, X=−0.4.

Figure 7:
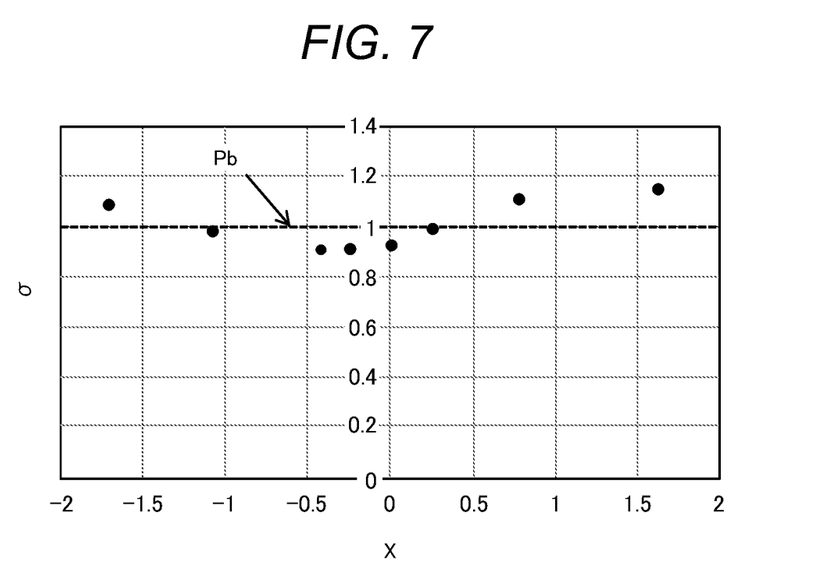
FIG. 7 is a graph showing an example of a result of estimating a thermal stress generated in the semiconductor chip according to the first embodiment by a finite element analysis.

FIG. 7 is a graph showing an example of a result of estimating the thermal stress generated in the semiconductor chip 1*a* by a finite element analysis. A horizontal axis is X, and a vertical axis is a normalized thermal stress G.

The material of the upper electrode 1*d* and the lower electrode 1*g* is Cu, and the material of the semiconductor chip 1*a* is Si. The material of the conductive bonding material 1*p* is a solder containing Sn as a main component, which is a general lead-free bonding material. X is changed in a range of −2 to 2. σ on the vertical axis is a value normalized by using, as a numerator, a thermal stress generated at the point p1 (a stress concentration position) of the semiconductor chip 1*a* in FIG. 6, and using, as a denominator, a stress generated at the point p1 when soft lead solder is used for the conductive bonding material 1*p* in the structure of the related art shown in FIG. 4. Therefore, in the figure, σ=1 is indicated by a symbol Pb. In the solder containing Sn as the main component, a content of Sn is larger than a content of any other metal element in the metal elements contained in the solder.

As shown in FIG. 7, the stress becomes minimum when X is −0.4 and increases as X moves away from −0.4. When X is 0.3 and −1.2, the stress rises to the same level as the stress of the structure of the related art.

In summary, a distance from an end portion of a connection surface of the second electrode with the semiconductor chip to an end portion of the semiconductor chip is set to W, a distance from the end portion of the connection surface of the second electrode with the semiconductor chip to a center line of the groove T is set to J, and when J/W is defined as X, a position of the center line of the groove T satisfies the following Equation (1).

$$-1.2 < X < 0.3 \quad (1)$$

Figure 8:
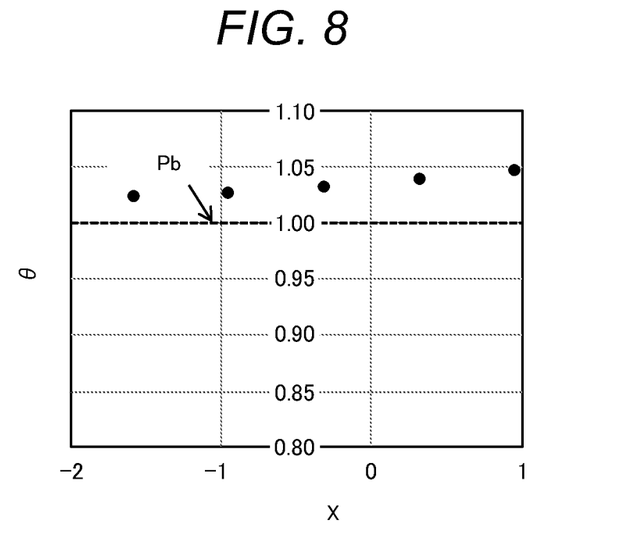
FIG. 8 is a graph showing an example of a result of estimating thermal resistance of a semiconductor device shown in FIG. 6 by the finite element analysis.

FIG. 8 is a graph showing an example of a result of estimating the thermal resistance by the finite element analysis. The horizontal axis is X, and the vertical axis is a normalized thermal resistance θ. X is changed in a range of −2 to 1. θ on the vertical axis is values obtained by normalizing the thermal resistances of the semiconductor device 200 shown in FIG. 6 using, as the denominator, the thermal resistance of the semiconductor device 200 including the electronic circuit body 100 of the structure of the related art shown in FIG. 4. Therefore, in FIG. 8, θ=1 is indicated by a symbol CS. Here, the thermal resistance is defined by an increment from an initial state of the heat amount calculated from the temperature distribution of the semiconductor device 200 in a steady state in which the semiconductor chip 1*a* operates and generates a predetermined heat generation amount. This is because it is considered that the larger this increment is, the smaller the heat dissipation to the outside is.

It can be seen from FIG. 8 that the larger X is, that is, the closer the position of the groove T is to the end portion of the lower electrode 1*g*, the larger the thermal resistance is. Therefore, in the range of X shown in FIG. 8, it is desirable that the position of the groove T is located inside the lower electrode 1*g* because the thermal resistance is suppressed to be low.

Considering the thermal stress shown in FIG. 7 and the thermal resistance shown in FIG. 8, it can be seen that when X is −0.4, the thermal stress is the minimum and the thermal resistance is also suppressed to be low.

By providing the groove T at the position where X=−0.4 as shown in FIG. 6, it is possible to suppress the concentration of the stress at the point p1 and minimize the amount of deformation. Further, since the upper electrode 1*d* is disposed directly above the groove T, it is possible to secure the heat dissipation path upward from the semiconductor chip 1*a* and suppress the thermal resistance from the semiconductor chip 1*a*.

In the present embodiment, the solder containing Sn as the main component is used as the conductive bonding material 1*p*. Since the solder containing Sn as the main component has a high modulus of elasticity and a high thermal conductivity as compared with a solder containing Pb as the main component, it is considered that when the solder containing Sn as the main component is applied to the structure of the related art as shown in FIG. 4, the stress generated in the semiconductor chip 1*a* increases and the thermal resistance decreases. Here, the stress needs to be considered, and by providing the groove T as in the present embodiment, the stress generated in the semiconductor chip 1*a* can be suppressed to the same level as or less than that of the structure of the related art using the solder containing Pb as the main component. In the present embodiment, the thermal resistance is increased by providing the groove T, and since the solder containing Sn as the main component is used, the thermal resistance can also be suppressed. Even when another Pb-free bonding material such as a sintered metal using Cu or Ag is used, it is expected that the same tendency is qualitatively obtained when the elastic modulus of the Pb-free bonding material is higher than that of Pb and the thermal conductivity thereof is higher than that of Pb.

The effect of the present embodiment is not limited to X=−0.4.

Figure 9:
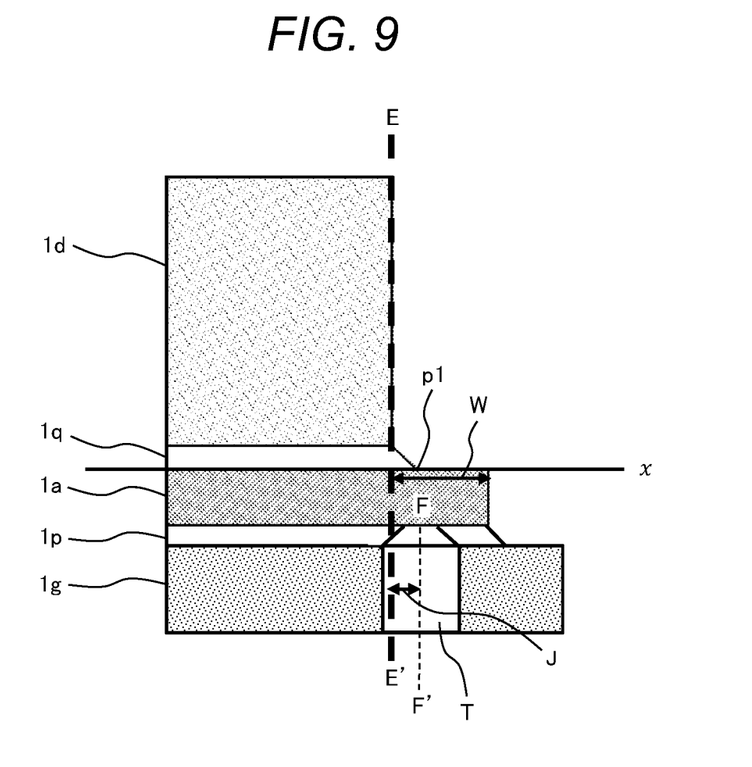
FIG. 9 is a vertical sectional view partially showing the semiconductor device in which a position of a grove is changed.

FIG. 9 is a vertical sectional view partially showing the semiconductor device in which the position of the groove T is changed.

In FIG. 9, the groove T is disposed such that the center line F-F' of the groove T is located outside the end portions E-E'. That is, in the example, X=0.25. Also, in this example, it can be said that the groove T is provided at a position overlapping with the second electrode.

In FIG. 9, since a region where the upper electrode 1*d* overlaps is small just above the groove T, the heat dissipation path upward from the semiconductor chip 1*a* is smaller than that when X=−0.4 shown in FIG. 6, but the increase amount of the thermal resistance is small as shown in FIG. 8.

It can be seen from FIG. 7 that even if X=0.25 as in the example of FIG. 9, the stress can be the same as that of the structure of the related art. Therefore, the stress reducing effect can be obtained even when X=−0.4 cannot be realized due to the restrictions of the electronic circuit body 100.

Next, the necessity that the groove T reaches the end portion of the lower electrode 1g will be described.

Figure 10:
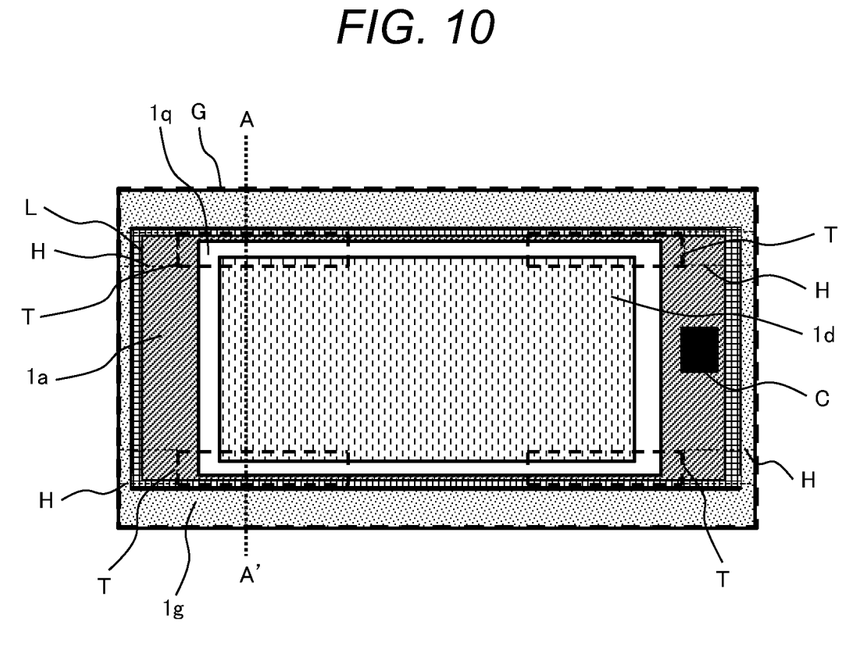
FIG. 10 is a plan view partially showing an electronic circuit body according to a comparative example.

FIG. 10 is a plan view partially showing an electronic circuit body according to a comparative example.

In FIG. 10, the grooves T do not reach the outer peripheral line G of the lower electrode 1g. The configuration other than the grooves T is the same as that in FIG. 3. The lower electrode 1g is connected by an outer peripheral region H (a rectangle shown by a broken line in contact with the end portion of the lower electrode 1g in FIG. 10). Therefore, the stress generated on both sides of the outer peripheral region H is transmitted without being divided, and an effect of reducing the stress applied to the semiconductor chip 1a cannot be obtained. Therefore, thermal deformation of the semiconductor chip 1a tends to be large.

Figure 11:
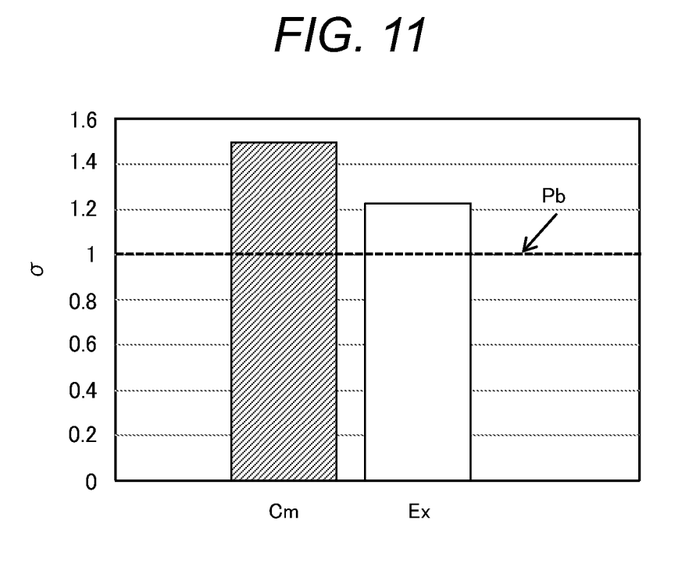
FIG. 11 is a graph showing a result of a thermal stress analysis obtained by comparing the embodiment shown in FIG. 3 with the comparative example shown in FIG. 10.

FIG. 11 is a graph showing a result of a thermal stress analysis obtained by comparing the embodiment shown in FIG. 3 with the comparative example shown in FIG. 10. In both the embodiment and the comparative example, the solder containing Sn as the main component, which is the lead-free bonding material, is used. The vertical axis represents the normalized stress σ as in FIG. 7. A stress when the lead solder is used for the conductive bonding material 1p is used as the denominator when the stress is normalized.

As shown in FIG. 11, the stress σ is as high as 1.48 in a comparative example Cm compared with 1.22 in an embodiment Ex. From this result, it can be seen that it is desirable that the groove T reaches the end portion of the lower electrode 1g.

Second Embodiment

Next, a semiconductor device according to a second embodiment will be described with reference to FIGS. 12 to 14.

Figure 12:
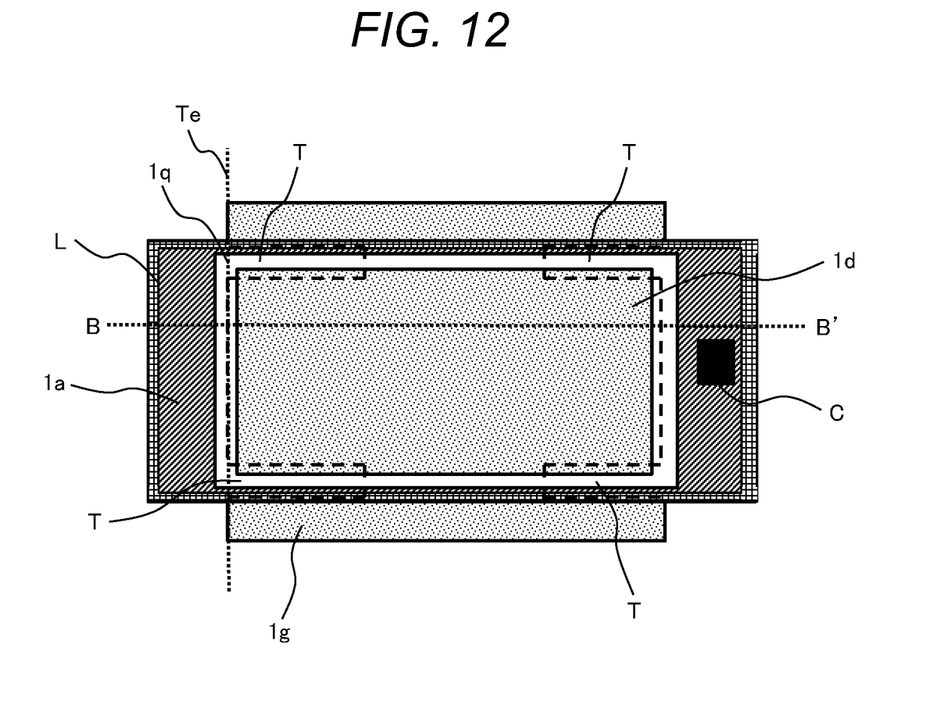
FIG. 12 is a plan view partially showing an electronic circuit body according to a second embodiment.

FIG. 12 is a plan view partially showing an electronic circuit body according to the present embodiment.

In FIG. 12, a width of the lower electrode 1g is small, and an end portion Te thereof is located inside the semiconductor chip 1a. The lower electrode 1g is provided with the grooves T.

Figure 13:
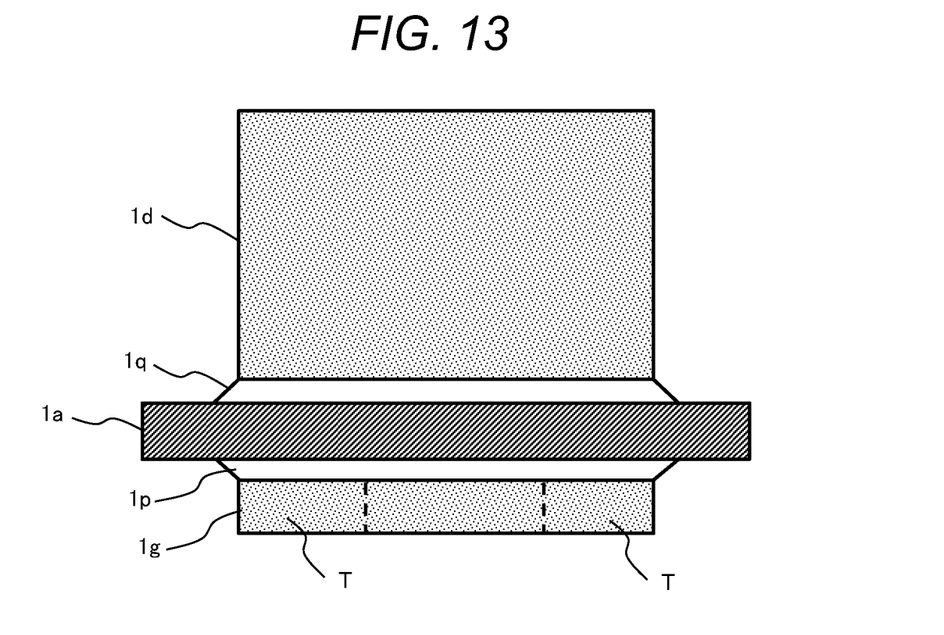
FIG. 13 is a cross-sectional view taken along a line B-B' in FIG. 12.

FIG. 13 is a cross-sectional view taken along a line B-B' in FIG. 12.

In FIG. 13, the end portion of the lower electrode 1g is located inside the semiconductor chip 1a.

Figure 14:
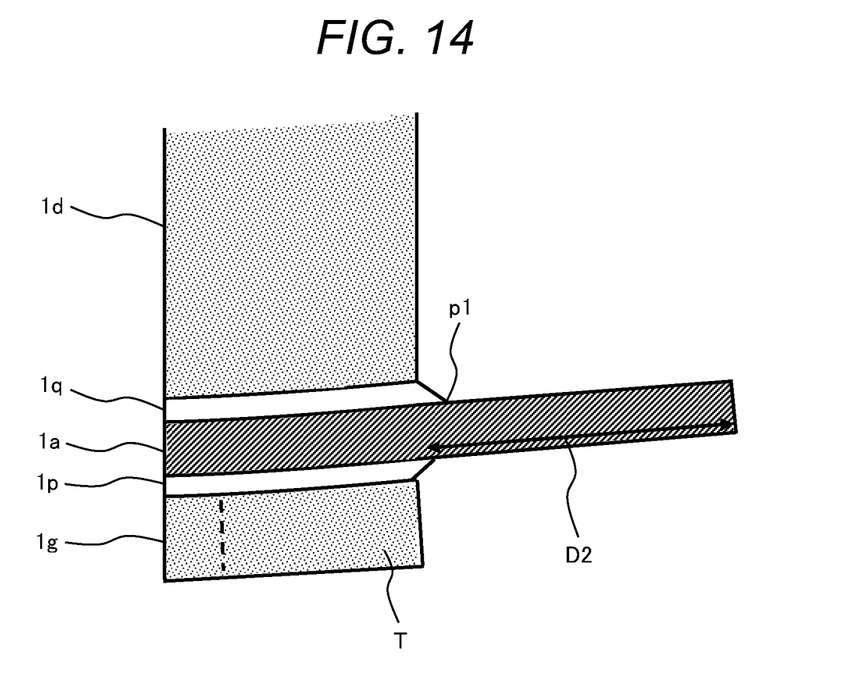
FIG. 14 is a partial vertical sectional view showing the vicinity of an end portion of a semiconductor chip according to the second embodiment.

FIG. 14 is a partial vertical sectional view showing the vicinity of an end portion of the semiconductor chip according to the present embodiment.

As shown in FIG. 14, the lower electrode 1g is not bonded in the region D2 located at the end portion of the semiconductor chip 1a. Therefore, for example, when the lower electrode 1g is thermally shrunk in a cooling process of a reflow step or a flow step, the end portion of the semiconductor chip 1a is not subjected to the stress from the lower electrode 1g. Accordingly, the stress at the point p1 can be reduced.

A configuration in which the end portion of the lower electrode 1g is located inside the end portion of the semiconductor chip 1a can also be applied to the configuration in which the grooves T are provided. The stress at the point p1 can be further reduced as compared with a configuration in which the grooves T are only provided in the lower electrode 1g.

Third Embodiment

Figure 15:
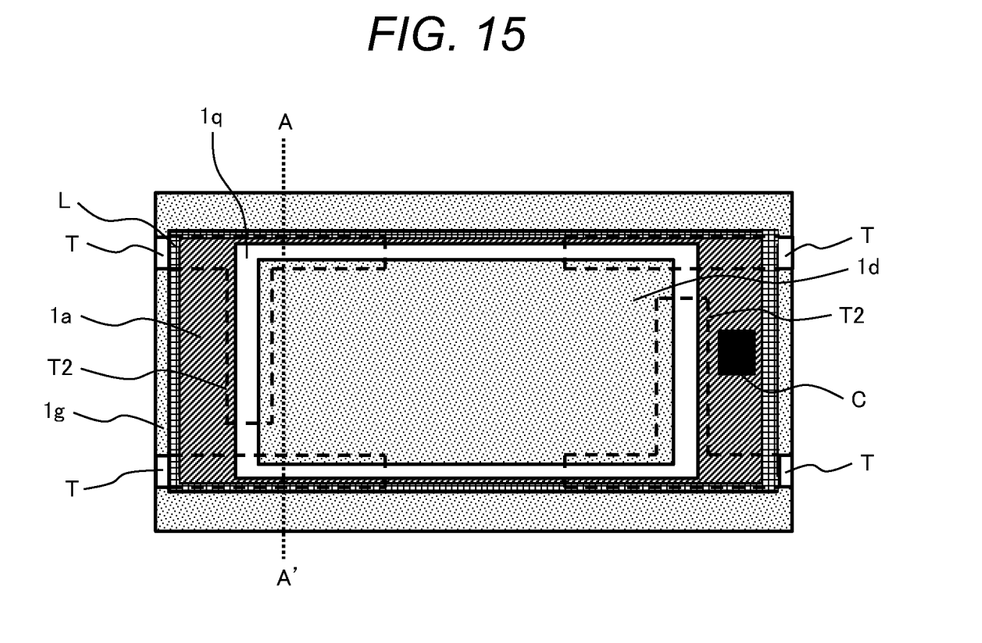
FIG. 15 is a plan view partially showing an electronic circuit body according to a third embodiment.

FIG. 15 is a plan view partially showing an electronic circuit body according to a third embodiment.

In FIG. 15, grooves T that reach the end portion along the longitudinal direction of the lower electrode 1g are provided, and grooves T2 are provided in two of the four grooves T. The grooves T2 are provided along the lateral direction of the lower electrode 1g. The grooves T2 are provided so as to communicate with the grooves T in the middle of the grooves T. In other words, the grooves T include branched grooves T2.

The configuration of the present embodiment is a configuration of the first embodiment shown in FIG. 3 with the grooves T2 added.

With such a configuration, the thermal deformation of the semiconductor chip 1a in both the longitudinal direction and the lateral direction of the lower electrode 1g can be suppressed, and the stress generated in the semiconductor chip 1a can be further reduced.

Figure 16:
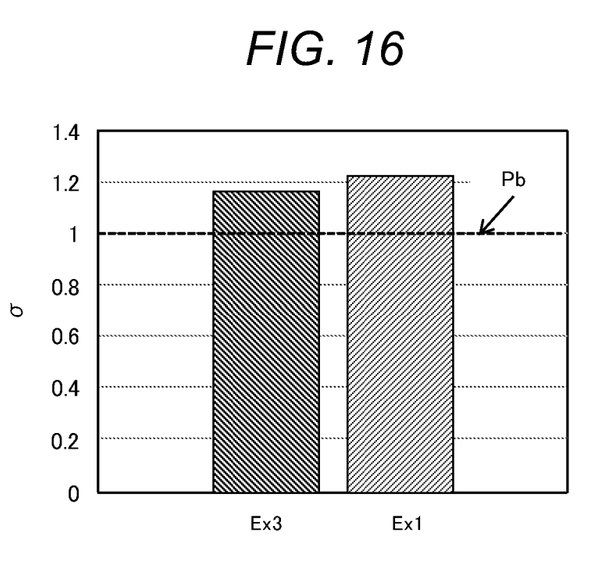
FIG. 16 is a graph showing an effect of a configuration of FIG. 15.

FIG. 16 is a graph showing an effect of a configuration of FIG. 15. Conditions are similar to those in FIG. 11.

As shown in FIG. 16, the thermal stress σ of the present embodiment (Ex3) is 1.17, which is smaller than that of the first embodiment (Ex1). Therefore, if the grooves T2 are added to the grooves T, an effect of further reducing the thermal stress can be obtained.

Hereinafter, the effects obtained by the semiconductor device of the present disclosure will be collectively described.

According to the semiconductor device of the present disclosure, it is possible to reduce the stress generated in the semiconductor chip, suppress the increase in the thermal resistance, and improve reliability.

Since the stress can be reduced, damage to the semiconductor chip can be prevented.

Since the increase in the thermal resistance can be suppressed, the failure of the semiconductor chip can be prevented.

Not only in a semiconductor device having a single-sided mounting structure but also in a semiconductor device having the double-sided mounting structure, it is possible to suppress the increase in temperature and prevent failure even if the current during use is increased.

What is claimed is:

1. A semiconductor device comprising:
    a semiconductor chip including
        a first main electrode on one surface thereof, and
        a second main electrode and a gate electrode on another surface thereof;
    a first electrode connected to the one surface of the semiconductor chip via a first bonding material; and
    a second electrode connected to the other surface of the semiconductor chip via a second bonding material, wherein
    the first electrode is a plate-shaped electrode and has a groove in a region overlapping with the semiconductor chip,
    the groove penetrates in a thickness direction of the first electrode and has a shape that reaches an end portion of the first electrode when viewed in a plan view,
    the groove overlapping with the semiconductor chip is provided along an end portion of the semiconductor chip in the vicinity of the end portion of the semiconductor chip when viewed in a plan view,
    a first region is a center side region of the semiconductor chip and a second region is an end portion side region of the semiconductor chip, the first region and the second region separated by the groove, and
    the semiconductor chip and the first electrode are connected via the first bonding material in each of the first region and the second region, the first bonding material of the first region and the first bonding material of the second region separated by the groove.

2. The semiconductor device according to claim 1, wherein
the groove has a width larger than a thickness of the first bonding material.

3. The semiconductor device according to claim 1, wherein
the groove is provided at a position overlapping with the second electrode.

4. The semiconductor device according to claim 1, wherein
a distance from an end portion of a connection surface of the second electrode with the semiconductor chip to an end portion of the semiconductor chip is set to W,
a distance from the end portion of the connection surface of the second electrode with the semiconductor chip to a center line of the groove is set to J,
when a center line of the groove T is closer to a center of the semiconductor chip than an end portion of the second electrode, J takes a negative value, and
when J/W is defined as X, a position of the center line of the groove satisfies the following Equation (1)

$$-1.2<X<0.3 \qquad (1).$$

5. The semiconductor device according to claim 1, wherein
the first bonding material and the second bonding material are solders containing Sn as a main component.

6. The semiconductor device according to claim 1, wherein
an end portion of the second electrode is located inside the semiconductor chip when viewed in a plan view, and the end portion of the first electrode is located outside the semiconductor chip when viewed in a plan view.

7. The semiconductor device according to claim 1, wherein
an end portion of the second electrode is located inside the semiconductor chip when viewed in a plan view, and the end portion of the first electrode is located inside the semiconductor chip when viewed in a plan view.

8. The semiconductor device according to claim 1, wherein
the groove includes a branched groove provided so as to communicate with the groove and branched from the groove.

* * * * *